(12) United States Patent
Hiblot et al.

(10) Patent No.: US 11,621,295 B2
(45) Date of Patent: Apr. 4, 2023

(54) BIPOLAR SELECTOR DEVICE FOR A MEMORY ARRAY

(71) Applicant: IMEC vzw, Leuven (BE)

(72) Inventors: Gaspard Hiblot, Leuven (BE); Shamin Houshmand Sharifi, Leuven (BE); Geert Van der Plas, Leuven (BE)

(73) Assignee: IMEC vzw, Leuven (BE)

( * ) Notice: Subject to any disclaimer, the term of this patent is extended or adjusted under 35 U.S.C. 154(b) by 253 days.

(21) Appl. No.: 17/092,130

(22) Filed: Nov. 6, 2020

(65) Prior Publication Data

US 2021/0143211 A1 May 13, 2021

(30) Foreign Application Priority Data

Nov. 12, 2019 (EP) .................................... 19208600

(51) Int. Cl.
*H01L 27/22* (2006.01)
*G11C 5/06* (2006.01)
*G11C 11/16* (2006.01)
*H01L 43/02* (2006.01)
*H01L 43/12* (2006.01)

(52) U.S. Cl.
CPC .............. *H01L 27/222* (2013.01); *G11C 5/06* (2013.01); *G11C 11/161* (2013.01); *H01L 43/02* (2013.01); *H01L 43/12* (2013.01)

(58) Field of Classification Search
CPC ....... H01L 27/222; H01L 43/02; H01L 43/12; H01L 2924/1434; H01L 2924/1431; H01L 27/0694; G11C 5/06; G11C 11/161
See application file for complete search history.

(56) References Cited

U.S. PATENT DOCUMENTS

| 2007/0047295 A1 | 3/2007 | Cho et al. | |
| 2010/0109061 A1 | 5/2010 | Kushida | |
| 2010/0181547 A1* | 7/2010 | Kuroda | H01L 27/2436 257/295 |

(Continued)

OTHER PUBLICATIONS

Wikipedia, Design rule checking, archived Nov. 11, 2018 (Year: 2018).*

(Continued)

*Primary Examiner* — Shih Tsun A Chou
(74) *Attorney, Agent, or Firm* — Knobbe Martens Olson & Bear, LLP

(57) ABSTRACT

The disclosed technology relates to the field of memory devices including memory arrays, and more particularly, to magnetic memory devices. In one aspect, the disclosed technology provides a method of fabricating a memory device, and the memory device. The method comprises: processing a plurality of selector devices in a semiconductor layer of a first substrate, processing an interconnect layer on a front-side of the semiconductor layer, the interconnect layer comprising an interconnect structure electrically connected to the plurality of selector devices, processing a plurality of memory elements in an oxide layer of the first substrate arranged on a back-side of the semiconductor layer, each memory element being electrically connected to one of the selector devices, and processing one or more vias through the semiconductor layer to electrically connect the memory elements to the interconnect structure.

20 Claims, 8 Drawing Sheets

(56) References Cited

U.S. PATENT DOCUMENTS

| | | | |
|---|---|---|---|
| 2011/0227158 A1* | 9/2011 | Zhu | H01L 25/50 438/479 |
| 2011/0298021 A1 | 12/2011 | Tada et al. | |
| 2015/0090952 A1 | 4/2015 | Huang | |
| 2016/0225426 A1 | 8/2016 | Naik et al. | |
| 2016/0268344 A1* | 9/2016 | Lin | H01L 27/2463 |
| 2019/0067368 A1 | 2/2019 | Tahmasebi et al. | |

OTHER PUBLICATIONS

R. Mandapati, et al., On Pairing of Bipolar RRAM Memory With NPN Selector Based on Set/Reset Array Power Considerations, IEEE Transactions on Nanotechnology, vol. 12, No. 6, Nov. 2013, pp. 1178-1184 (Year: 2013).*

Andreas Plößl, et al., Silicon-on-insulator: materials aspects and applications, Solid-State Electronics 44 (2000) 775-782 (Year: 2000).*

S. M. Sze, et al., Physics of Semiconductor Devices, Third Edition, 2007, John Wiley & Sons, Inc., pp. 219-222 (Year: 2007).*

Extended European Search Report dated Mar. 24, 2020 in corresponding European patent application No. 19208600.7 filed Nov. 12, 2019.

* cited by examiner

BIPOLAR SELECTOR DEVICE FOR A MEMORY ARRAY

CROSS-REFERENCE TO RELATED APPLICATIONS

This application claims foreign priority to European Application EP 19208600.7, filed on Nov. 12, 2019, which is incorporated herein by reference in its entirety.

BACKGROUND

Technological Field

The disclosed technology relates to the field of memory devices, and more particularly, to memristors, like magnetic or resistive memory devices. The disclosed technology provides a method of fabricating a memory device, wherein the focus is specifically on processing a plurality of selector devices for a plurality of memory elements of the memory device. The disclosed technology further provides the memory device.

Description of the Related Technology

High-density memory arrays, e.g., magnetic random access memory (MRAM) arrays can suffer from the so-called sneak path problem. This problem arises from cross-talk interference between adjacent memory cells caused by a sneak path current, e.g., between a read-out cell and a neighboring cell. This can result in misinterpretation of the read-out signal of the read-out cell.

Selector devices can be used to protect the read-out signals. The selector devices provide a threshold (diode behavior) for device selection based on word-line and bit-line (source line) voltage. That is, the sneak path problem can be mitigated by inserting selector devices next to the memory cells of the memory array.

In particular, in one approach of a magnetic memory device shown in FIG. 8, a selector device 81 is inserted on top of each magnetic tunnel junction (MTJ) element 82 in the back end of line (BEOL). However, the limitation of this approach is that the inserted selector devices 81 obstruct the BEOL, and therefore reduce the interconnect density that can be achieved towards a computing platform (e.g., for a logic-memory interconnect). In other words, it is difficult to achieve a high interconnect density with, e.g., a logic chip, because the BEOL area is fully occupied by the memory elements 82 and selector device 81.

In addition, the BEOL-fabricated selector devices 81 are not very efficient, in particular, they suffer from high leakage and low mobility, due to defects in amorphous and poly-crystalline materials used in the BEOL.

SUMMARY OF CERTAIN INVENTIVE ASPECTS

In view of the above, one objective of the disclosed technology aims to provide an improved solution to the sneak path problem. Another objective is to provide a memory device, and a method of fabricating the memory device, wherein the memory device is more efficient and has a higher interconnect density, for instance, to connect a memory array and a logic chip. In some embodiments, the memory device should have improved selector devices, and an improved arrangement of selector devices and memory elements. Further, it should be possible to dispose the selector devices with the same pitch as the memory elements of the memory array.

The objectives are achieved by the embodiments of the invention provided in the enclosed independent claims. Advantageous implementations of these embodiments are defined in the dependent claims.

In some embodiments, the disclosed technology solve the above problems by, firstly, fabricating selector devices in the substrate front-side, which leads to better efficiency and enables the same pitch as for the memory elements, and, secondly, by putting the memory elements on the substrate back-side, in order to enable higher bandwidth interconnections.

A first aspect of the disclosed technology provides a method of fabricating a memory device, wherein the method comprises: processing a plurality of selector devices in a semiconductor layer of a first substrate, processing an interconnect layer on a front-side of the semiconductor layer, the interconnect layer comprising an interconnect structure electrically connected to the plurality of selector devices, processing a plurality of memory elements in an oxide layer of the first substrate arranged on a back-side of the semiconductor layer, each memory element being electrically connected to one of the selector devices, and processing one or more vias through the semiconductor layer to electrically connect the memory elements to the interconnect structure.

Using the method of the first aspect, the selector devices can be fabricated in a front-side of the first substrate, in some embodiments they can be manufactured in the FEOL. This allows processing the selector devices in a high quality semiconductor layer. Thus, the selector devices show less leakage and a higher mobility, due to less defects in the semiconductor layer than, e.g., in amorphous or poly-crystalline semiconductor layers. The selector devices are therefore more efficient.

The interconnect layer, which includes the interconnect structure, can be manufactured in the BEOL. Accordingly, the interconnect structure may be a BEOL connection. The interconnect structure may be any structure that allows electrically connecting to the selector devices from the outside of the first substrate. The interconnect layer may be any kind of layer including such an interconnect structure.

Furthermore, the memory elements can be processed in the back-side of the first substrate, particularly they can be manufactured after the BEOL. Thus, the memory elements do not obstruct the BEOL, in particular not the interconnect structure, and therefore a higher interconnect density and bandwidth is possible. In addition, a lower thermal budget and a lower aspect ratio are possible, compared to selector devices and memory elements that are processed in the BEOL. The lower aspect ratio is possible, because the memory elements and the selector devices are not stacked together, so that it is not necessary to etch high aspect ratio pillars each comprising a memory element and a selector device. Another advantage is that the selector devices can be disposed with the same pitch as the memory elements.

Overall an improved memory device is created, and an improved solution to the sneak path problem is further provided.

The memory device fabricated by the method of the first aspect may be a magnetic memory device including magnetic memory elements, e.g., MRAM elements like MTJs. The memory device may alternatively be a resistive memory device including resistive memory elements, e.g., may be a resistive random access memory (RRAM). The memory device fabricated by the method is of the "1S1M" architecture, i.e., there is one selector device for each memory element. In some embodiments, the memory device is preferably not of the "1T1M" architecture, with one transistor for each memory element. The selector devices may be bipolar selector elements. In some embodiments, the selector devices may be bipolar transistors operated with a floating base. The one or more vias may be one or more through-silicon vias (TSV) connecting the interconnect structure with rows of memory elements As used herein, "front side" and "back side" of the first substrate refer to opposite sides of the semiconductor layer. The "front-side" may be the side that is processed first, e.g., in the FEOL, and the "back-side" may be the side that is processed last, e.g., after the BEOL. Further, in this document, a layer being "provided on" or "arranged on" another layer may either mean that the layer is arranged "below" or "above" the other layer. Thereby, the terms "below"/"above" or "bottom"/"top" relate to layers of the material stack, in particular to the fabrication/growth direction of these layers. In any case, "provided on" or "arranged on" means that the layer is in contact with the other layer.

In an embodiment, the method further comprises, after processing the interconnect layer and before processing the memory elements: bonding the first substrate to a second substrate including a logic chip, wherein the first substrate is bonded with the interconnect layer to the second substrate such that the interconnect structure is electrically connected to the logic chip.

The method of the first aspect thus allows creating a high bandwidth connection of the memory elements and the logic chip, in some embodiments by means of the one or more vias connecting the memory elements to the interconnect structure and the interconnect structure further connecting to the logic chip. The logic chip may comprise a high-performance computing platform, for example, based on fin field effect transistor (FinFET) technology. However, the logic chip can alternatively be planar or based on nanowires, for example. The bonding may be hybrid bonding.

In an embodiment, the interconnect layer further comprises a periphery of the plurality of memory elements.

That means, the interconnect layer may comprise the interconnect structure and the periphery (or a part of the periphery) of the memory elements. The interconnect layer may thus comprise a mix of BEOL connection and periphery (elements). The periphery is, in some embodiments, not a part of the interconnect structure. The periphery of the memory elements, i.e., of the memory array, may include one or more CMOS circuits, e.g., sense-amplifiers, and/or level shifters, and/or other memory circuit elements. The interconnect layer may thus be a periphery layer. Additionally or alternatively, it is possible to form periphery of the memory elements in the FEOL, e.g., together with the selector devices in the semiconductor layer. Further, it is possible to provide the periphery of the memory array on the second substrate, e.g., to fabricate the periphery together with the logic chip on the second substrate.

In an embodiment, the semiconductor layer is a crystalline semiconductor layer.

Thus, the selector devices processed in this semiconductor layer can have a particularly high efficiency, e.g., in terms of leakage and mobility.

In an embodiment, each selector device comprises an NPN bipolar transistor with a floating base, or a PNP bipolar transistor with a floating base, or an NP diode, or a PN diode.

The fabricated memory device is thereby of the "1S1M" architecture, i.e., each selector device is a selector in the sense of "1S1M". Each selector device may be a 2-terminal device. In case of a bipolar transistor, this is still a 2-terminal device because it has the floating base.

In an embodiment, the selector devices are processed by forming blanket implants or are processed by epitaxy, and the selector devices are isolated from each other by shallow trench isolation.

This enables a selector device pitch that is in the same order, or even the same, as a pitch of the memory elements. For instance, this pitch may be around 50 nm.

In an embodiment, the blanket implants are formed with different N/P/N or P/N/P implant energies to respectively form NPN or PNP bipolar transistors with a floating base; and/or the blanket implants are formed with different N/P or P/N implant energies to respectively form NP or PN diodes.

Forming the blanket implants with different N/P/N implant energies achieves floating-base bipolar transistors.

In an embodiment, the selector devices are formed over the entire thickness of the semiconductor layer.

The thickness of the semiconductor layer can, in some embodiments, be selected such that an etching thereof will expose the deepest doping layer of the selector device(s).

In an embodiment, the selector devices are processed in a front-side of the first substrate.

For instance, they are processed in the FEOL. A higher quality semiconductor layer, for instance a crystalline semiconductor layer, can be used, leading to a higher efficiency of the selector devices. Further, the selector devices do not obstruct the BEOL.

In an embodiment, the memory elements are processed after a back end of line.

Thus, a lower thermal budget and lower aspect ratio is possible, since BEOL and bonding may already be processed before processing the memory elements.

In an embodiment, the selector devices and the memory elements are, respectively, arranged regularly with the same pitch, in some embodiments each with a pitch in a range Of 25-100 nm.

In an embodiment, the first substrate is a semiconductor-on-insulator substrate comprising a semiconductor substrate layer, the oxide layer arranged on the semiconductor substrate layer, and the semiconductor layer arranged on the oxide layer.

In an embodiment, the method further comprises, before processing the memory elements in the oxide layer of the first substrate, thinning the first substrate to remove the semiconductor substrate layer and to expose the oxide layer.

A second aspect of the disclosed technology provides a memory device fabricated with a method according to the first aspect or any embodiment thereof.

The memory device of the second aspect may be a magnetic memory device, and enjoys the advantages mentioned above with respect to its fabrication method.

A third aspect of the disclosed technology provides a memory device, comprising: a plurality of selector devices formed in a semiconductor layer of a first substrate, an interconnect layer arranged on a front-side of the semiconductor layer, the interconnect layer comprising an interconnect structure electrically connected to the plurality of selector devices, a plurality of memory elements formed in an oxide layer of the first substrate arranged on a back-side of the semiconductor layer, each memory element being electrically connected to one of the selector devices, and one or more vias through the semiconductor layer electrically connecting the memory elements to the interconnect structure.

In an embodiment, the memory device further comprises: a second substrate including a logic chip, wherein the first substrate is bonded with the interconnect layer to the second substrate such that the interconnect structure is electrically connected to the logic chip.

The memory device of the third aspect may be a magnetic memory device, and enjoys the advantages mentioned above with respect to the fabrication method of the first aspect.

BRIEF DESCRIPTION OF THE DRAWINGS

The above described aspects and implementations are explained in the following description of embodiments with respect to the enclosed drawings.

DETAILED DESCRIPTION OF CERTAIN ILLUSTRATIVE EMBODIMENTS

Figure 1:
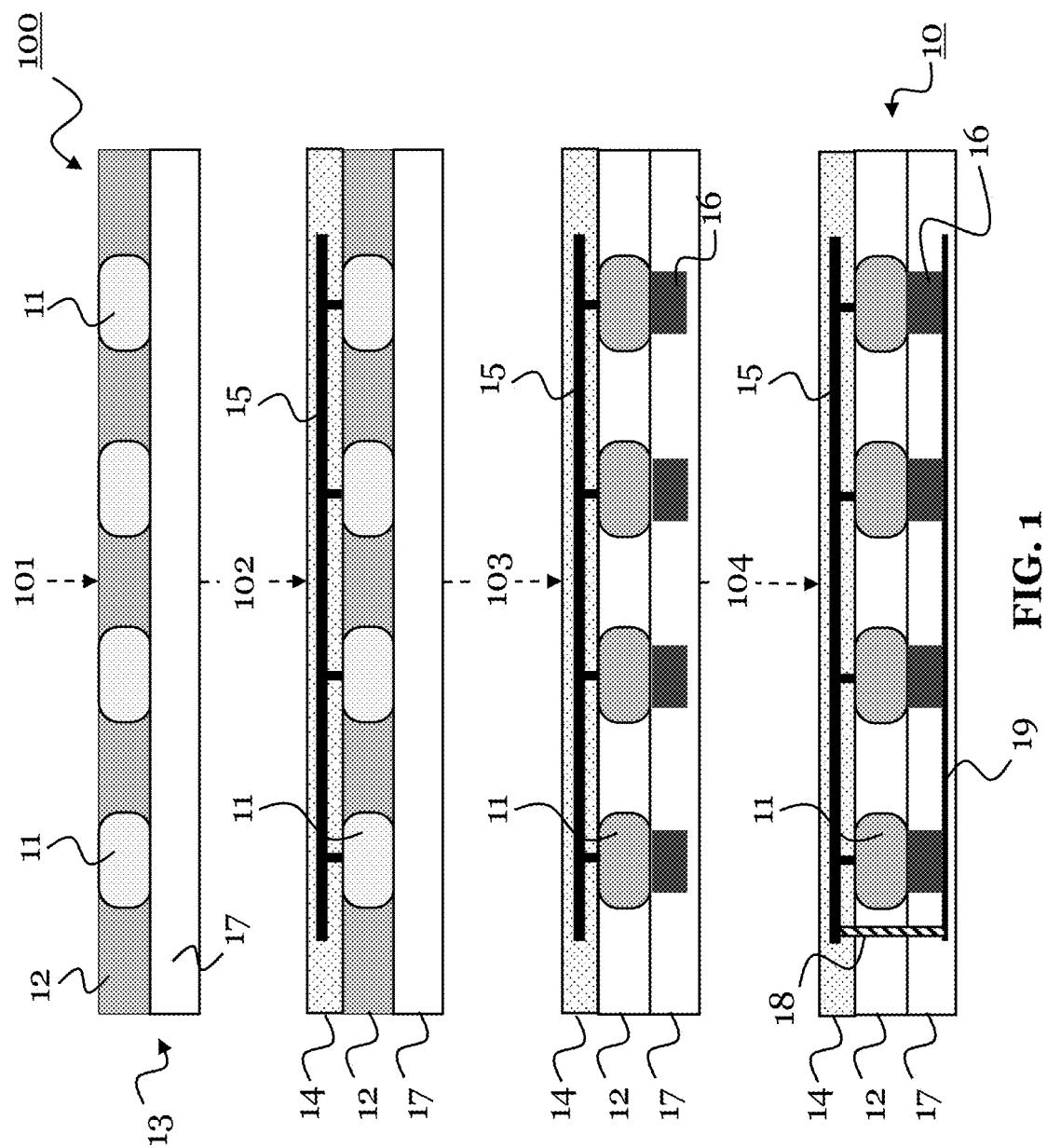
FIG. 1 shows a method according to an embodiment of the disclosed technology, resulting in a memory device according to an embodiment of the disclosed technology.

FIG. 1 shows a method 100 for fabricating a memory device 10, wherein the method 100 comprises several processing steps, which are schematically illustrated in FIG. 1.

In some embodiments, the method 100 comprises a step 101 of processing a plurality of selector devices 11 in a semiconductor layer 12 of a first substrate 13 (or wafer). The semiconductor layer 12 may, in some embodiments, be a crystalline semiconductor layer, e.g., crystalline silicon layer. The selector devices 11 may be processed in a front-side of the first substrate 13, particularly in the FEOL.

The method 100 further comprises a step 102 of processing an interconnect layer 14 on a front-side of the semiconductor layer 12, wherein the interconnect layer 14 comprises an interconnect structure 15, which is electrically connected to the plurality of selector devices 11. The interconnect structure 15 may be used to connect memory elements 16 processed on the first substrate 13 electrically to another chip, e.g., to a logic chip, e.g., processed on another substrate. The interconnect structure 15 may be formed in the interconnect layer 14 together with periphery of the memory elements 16.

The method 100 further comprises a step 103 of processing a plurality of memory elements 16 in an oxide layer 17 of the first substrate 13, which oxide layer 17 is arranged on a back-side of the semiconductor layer 12. Each memory element 16 is electrically connected to one of the selector devices 11, i.e. the memory device may be of the "1S1M" architecture. The memory elements 16 may be processed after a BEOL. Each memory element 16 may be a magnetic memory element, e.g., for an MRAM device, for instance, including a MTJ stack.

Finally, the method 100 comprises a step 104 of processing one or more vias 18 through the semiconductor layer 12, in order to electrically connect the memory elements 16 to the interconnect structure 15. For instance, shown in FIG. 1 as an example, at least one via 18 may be connected on its one side to the interconnect structure 15, may pass from the interconnect layer 14 through the semiconductor layer to the oxide layer 17, and may be connected on its other side to, e.g., a metal line 19 connecting it with one or more of the memory elements 16.

As will be shown further below, the steps 101-104 of the method 100 are not necessarily steps, which directly following one another. The method 100 may comprise further steps, either after the steps 101-104 or in between these steps 101-104.

After step 104 of the method 100 shown in FIG. 1, a memory device 10 may be obtained. This memory device 10 comprises, as shown in FIG. 1: the plurality of selector devices 11, which are formed in the semiconductor layer 12 of the first substrate 13; the interconnect layer 14, which is arranged on a front-side of the semiconductor layer 12, wherein the interconnect layer 14 comprises the interconnect structure 15 that is electrically connected to the plurality of selector devices 11; the plurality of memory elements 16, which are formed in the oxide layer 17 of the first substrate 13, which oxide 17 layer is arranged on the back-side of the semiconductor layer 12, each memory element 16 being electrically connected to one of the selector devices 11; and the one or more vias 18 through the semiconductor layer 12, electrically connecting the memory elements 16 to the interconnect structure 15. The one or more vias 18 are inserted to connect, for instance, a top electrode of a MTJ memory element 16 to the front-side of the first substrate 13.

Of course, the memory device 10 may include further features, as will be described below, in particular, if the method 100 for fabricating the memory device 10 includes further steps.

By fabricating the memory device 10 with the method 100, a space in the BEOL, which is required to enable a high interconnect density of the interconnect structure 15, is made available by putting the selector devices 11 as through-substrate devices, and further by putting the memory elements 16 as back-side devices directly connected to the selector devices 11. An extra advantage of the method 100 and the memory device 10, respectively, is that the rest of the space in the first substrate 13 can be used to insert a periphery of the memory elements 16, e.g., including a sense-amplifier, and/or level shifters, and/or other memory circuit elements, which are more difficult to realize in FinFET devices, due to their process constraints and low operating voltages. That is, the interconnect layer 14 may further comprise a periphery of the memory array, particularly for reading out or writing into the memory elements 16. The interconnect layer 14 then includes the interconnect structure 15 and periphery of the memory elements. Periphery may also or alternatively be provided in the semiconductor layer 12 beneath the interconnect layer 14.

For fabricating a specific memory device 10 according to an embodiment of the disclosed technology, a thinned cheap CMOS wafer may be used as the first substrate 13. This first substrate 13 may be bonded, in some embodiments may be hybrid-bonded, to a second substrate 20 including a high performance computing platform (e.g., a FinFET). This will be illustrated in the following with respect to FIG. 2-FIG. 4.

Figure 2:
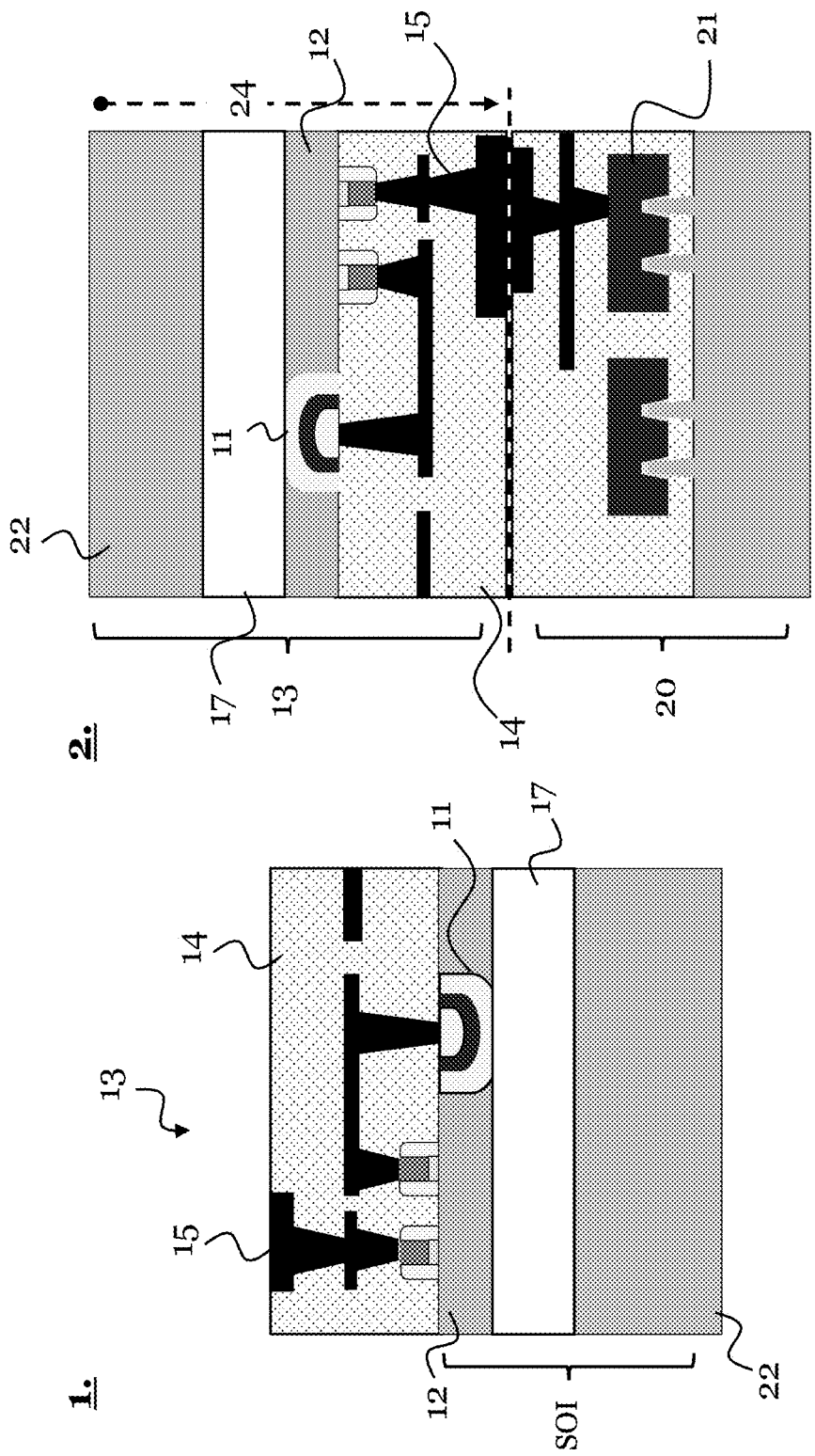
FIG. 2 shows steps 1-2 of a method according to an embodiment of the disclosed technology.
Figure 3:
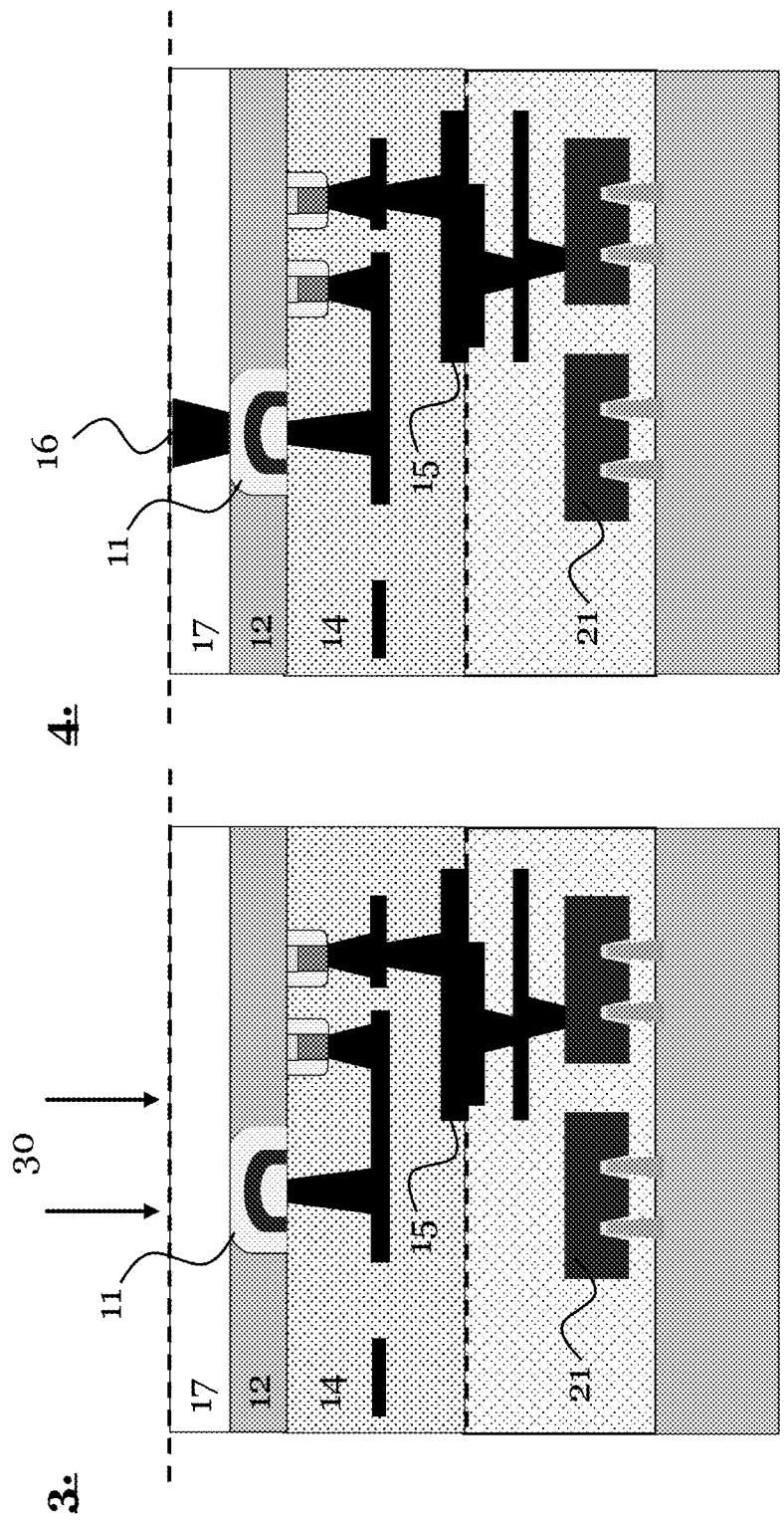
FIG. 3 shows steps 3-4 of a method according to an embodiment of the disclosed technology.
Figure 4:
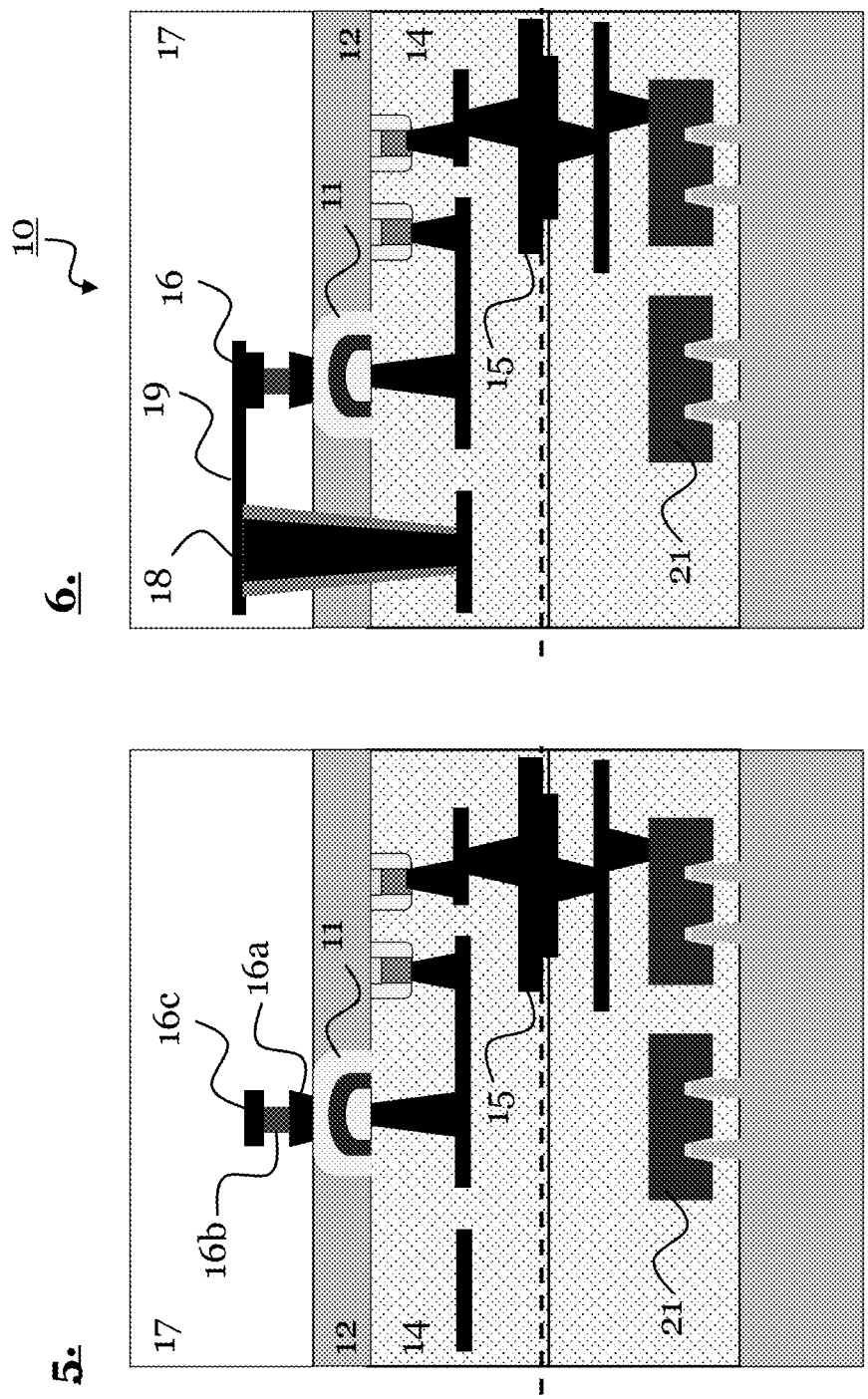
FIG. 4 shows steps 5-6 of a method according to an embodiment of the disclosed technology, resulting in a memory device according to an embodiment of the disclosed technology.

In particular, FIG. 2-FIG. 4 illustrate a method 100 according to an embodiment of the disclosed technology, which builds on the embodiment illustrated in FIG. 1. The method 100 of FIG. 2-FIG. 4 includes further, optional, method steps. The method 100 specifically includes steps 1-6, which include the general steps 101-104 shown in FIG. 1.

FIG. 2 shows step 1 and step 2 of the method 100 according to an embodiment of the disclosed technology.

Step 1 relates to the steps 101 and 102 of the general method 100 shown in FIG. 1. In step 1, a semiconductor-on-insulator (SOI) substrate or wafer is used as the first substrate 13, and comprises a semiconductor substrate layer 22 (e.g., a silicon layer), the oxide layer 17 (e.g., a silicon oxide layer), which is arranged on the semiconductor substrate layer 22, and the semiconductor layer 12 (e.g., a crystalline silicon layer), which is arranged on the oxide layer 17. A planar relaxed and cheap CMOS technology can be used to process the interconnect structure 15 in the interconnect layer 14, e.g., as a memory read-out circuitry. The interconnect layer 14 may comprise a silicon oxide layer embedding the interconnect structure 15.

The selector devices 11 may be processed as N/P/N, or P/N/P structures, or alternatively as N/P or P/N structures. In some embodiments, each selector device 11 may comprise an NPN bipolar transistor with a floating base, or may comprise a PNP bipolar transistor with a floating base, or may comprise an NP diode, or may comprise a PN diode. The selector devices 11 may thereby be formed over the entire thickness of the semiconductor layer 12. This allows exposing the deepest doping layer, e.g., by etching.

Step 2 is performed after the step 102, and before step 103, of the general method 100 of FIG. 1. Step 2 comprises a step of bonding 24 the first substrate 13 (or first wafer) to a second substrate 20 (or second wafer), the second substrate 20 including a logic chip 21, e.g., FinFET CMOS technology for logic computing. In some embodiments, the first substrate 13 may be bonded 24 with the interconnect layer 14 to the second substrate 20, such that the interconnect structure 15 is electrically connected to the logic chip 21. In this way, it may provide a high interconnect bandwidth between the logic chip 21 and the memory elements 16. The bonding may be hybrid bonding and/or wafer-to-wafer bonding.

In step 3, the semiconductor substrate layer is removed, e.g., by thinning. The thickness of the oxide layer 17 can be directly used as back-side BEOL oxide.

Step 4 relates to step 103 of the general method 100 of FIG. 1. In some embodiments, the plurality of memory elements 16 may be processed in the BEOL oxide (oxide layer 17). For example, as illustrated, MTJ memory elements may be processed as the memory elements 16.

Step 5 shows how the complete MTJ memory elements 16 can be processed, each memory element 16 including a MTJ bottom electrode 16a connected to a selector device 11, further including the MTJ 16b, and further including a MTJ top electrode 16c.

Step 6 relates to step 104 of the general method 100 of FIG. 1. The one or more vias 18 are processed through the semiconductor layer 12, in order to electrically connect the memory elements 16 to the interconnect structure 15. A via 18 may thereby connect, on the one side, to the MTJ top electrode 16c, e.g., over a metal line 19, and, on the other side, to a metal contact of the interconnect structure 15. A pitch of multiple vias 18 processed is not a problem, because there can be one via 18 per row of memory elements 16, not one via 18 per memory element 16. After step 6, the full structure of the memory device 10 is obtained, i.e., FIG. 3, step 6, shows a memory device 10 according to an embodiment of the disclosed technology.

Figure 5:
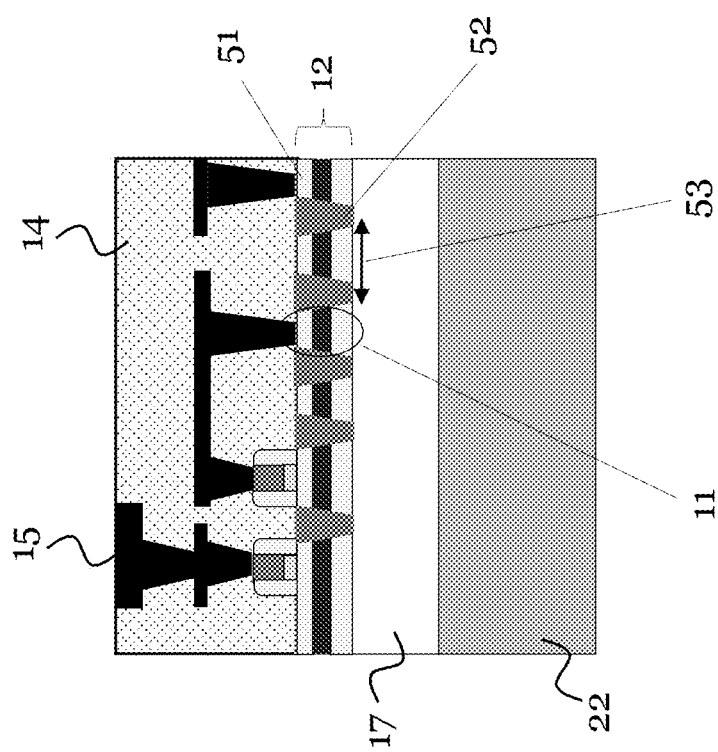
FIG. 5 shows a high density embodiment of selector devices for a memory device according to an embodiment of the disclosed technology.

FIG. 5 shows a high-density embodiment of selector devices 11 for a memory device 10 according to an embodiment of the disclosed technology.

In order to fabricate the high-density selector devices 11, i.e. multiple selector devices 11 arranged with a very small pitch, blanket implants 51 may be combined with shallow trench isolation (STI) 52. In some embodiments, each selector device 11 (each "real" selector device) may be obtained by one of multiple blanket implants 51 (or one of multiple regions of a blanket implant 51) isolated by STIs 52. That is, a STI 52 is arranged between each two neighboring blanket implants 51 or regions. This embodiment with blanket implants 61 enables the pitch of the selector devices 11 to reach same pitch as of the memory elements 16 (e.g., MRAM target, e.g., 50 nm). In some embodiments, the selector device pitch is determined by the STI pitch. Another option is to fabricate the selector devices 11 by epitaxy, and to separate them likewise with STI 52, in order to achieve a high pitch.

The blanket implants 51 may be formed with different N/P/N or P/N/P implant energies, in order to respectively form an NPN or PNP bipolar transistor with a floating base for each selector device 11. The blanket implants 51 may, in some embodiments, be formed with different N/P or P/N implant energies, in order to respectively form an NP or PN diode for each selector device 11.

Figure 6:
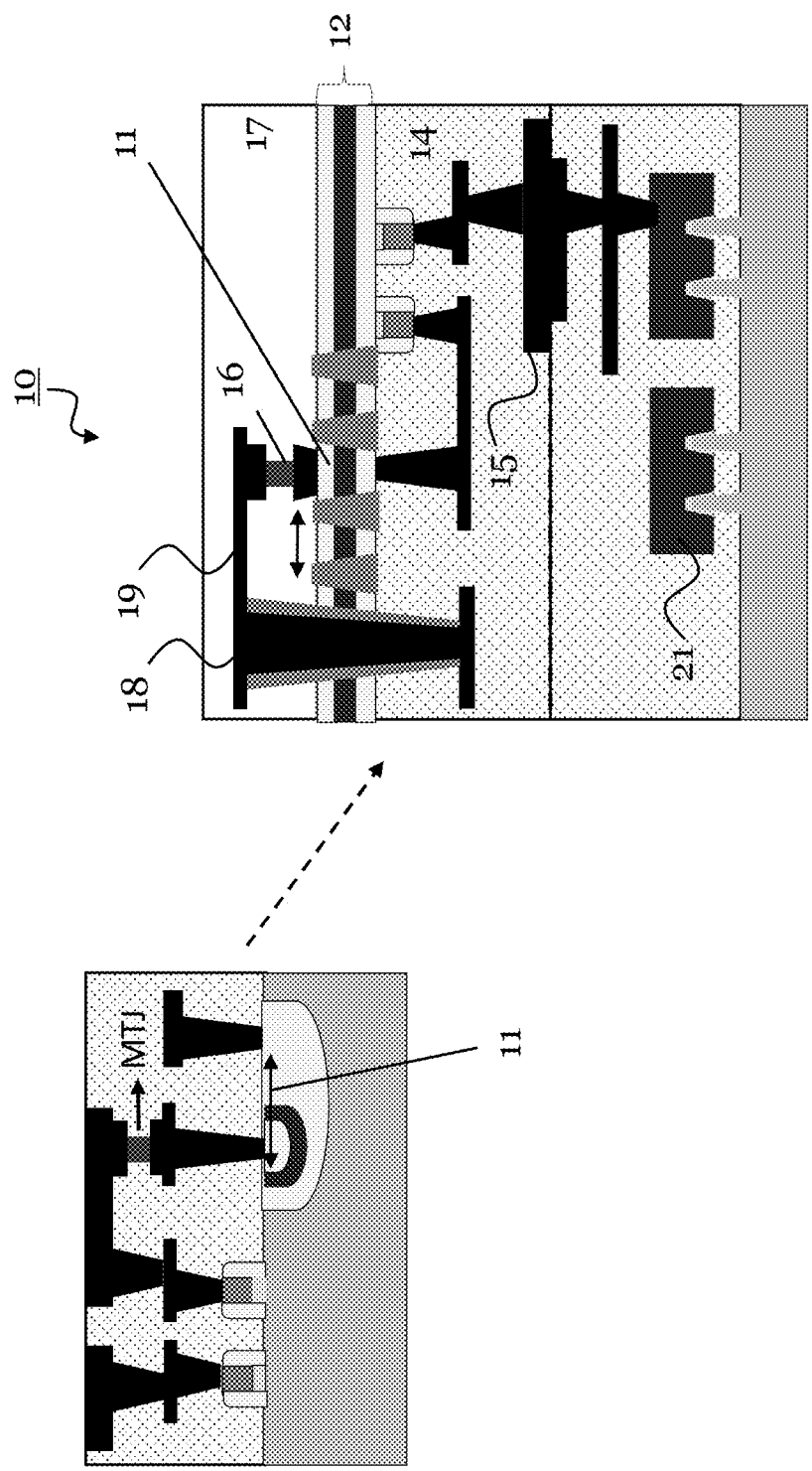
FIG. 6 shows a high density embodiment of selector devices for a memory device according to an embodiment of the disclosed technology.

FIG. 6 still shows a high-density embodiment of selector devices 11 for a memory device 10 according to an embodiment of the disclosed technology (right side of FIG. 6). Further, FIG. 6 shows a low-density embodiment (left side of FIG. 6) with a high planar NPN selector pitch. Such a planar NPN selector device 11 requires a collector and emitter contact from the front-side, which limits the pitch By using extreme thinning technology (with a SOI substrate 13), processing of vias 18 (e.g., TSVs through the semiconductor layer 12), bonding of the first substrate 13 and the second substrate 20, and back-side processing of the memory elements 16, an embedded high-density memory array can be obtained with NPN selector devices 11. Other embodiments (e.g., a memory array periphery bonded wafer) would not enable this high pitch density for the selector devices 11. Further, the memory elements 16 advantageously see a lower thermal budget (since BEOL and bonding may already be processed).

Figure 7:
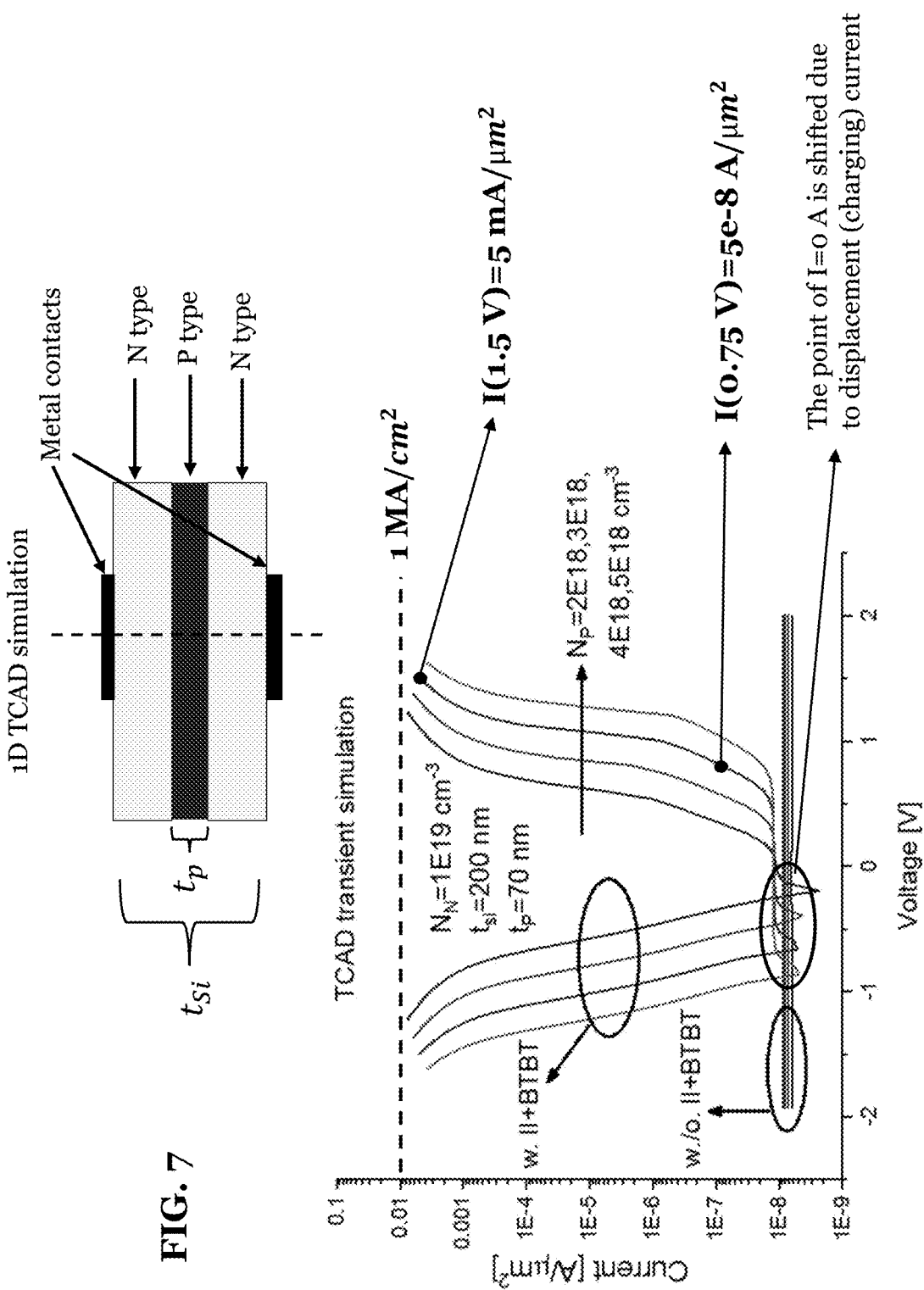
FIG. 7 shows simulations of a selector device for a memory device according to an embodiment of the disclosed technology.
Figure 8:
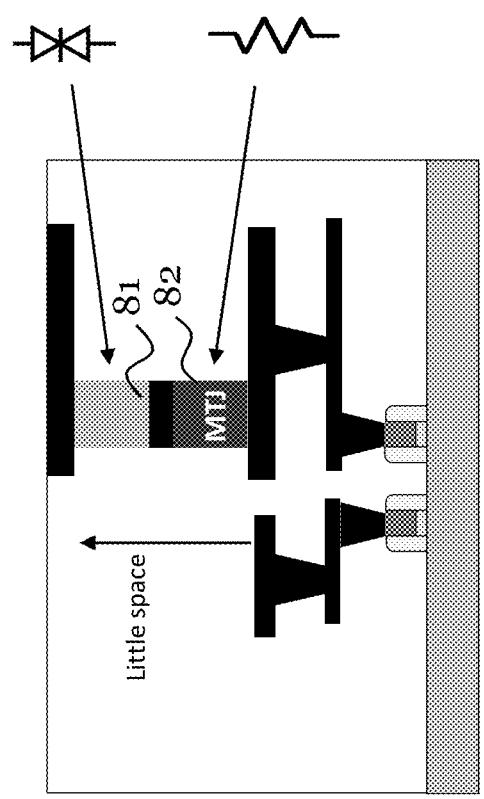
FIG. 8 shows a conventional selector device in a conventional memory device.

FIG. 7 shows simulations of a selector device 11 for a memory device 10 according to an embodiment of the disclosed technology. Conventional diode selectors are uni-directional, but a bidirectional selector device 11 is needed, for instance, for read and write operations in an MRAM device. As an example, an NPN type selector device 11 is used (however, this could alternatively be replaced by PNP). Without being bound by theory, the NPN can be made a strong bidirectional selector device 11 as a result of impact ionization (II) and band-to-band tunneling (BTBT), and by providing abrupt doping profiles and high doping densities. This triggers the open-base bipolar behavior of the selector device 11. The NPN stack for the selector device 11 can be built either using poly or SOI wafers (crystalline). Crystalline material is assumed in the TCAD simulations shown in FIG. 7.

II and BTBT enable abrupt switching of the selector device 11, due to open base bipolar amplification. Notably, transient simulations are required to simulate this selector device 11 (cannot be done with quasi-stationary). The simulation results can be observed in the graph shown in FIG. 1. It is shown that good bidirectional selection behavior is achieved.

In summary, the disclosed technology provides a fabrication method 100 for a memory device 10 with improves selector device 11 and memory element 16 processing, for a more efficient memory device 10 enabling high density connections of the memory elements 16 and a logic chip 21.

What is claimed is:

1. A method of fabricating a memory device, the method comprising:
    forming a plurality of selector devices in a semiconductor layer of a first substrate by forming blanket implants or by epitaxy, wherein the selector devices are isolated from each other by shallow trench isolation;
    forming an interconnect layer on a front-side of the semiconductor layer, the interconnect layer having an interconnect structure electrically connected to the plurality of selector devices;
    forming a plurality of memory elements in an oxide layer of the first substrate arranged on a back-side of the semiconductor layer, each memory element being electrically connected to one of the selector devices; and
    forming one or more vias through the semiconductor layer to electrically connect the memory elements to the interconnect structure.

2. The method according to claim 1, further comprising, after forming the interconnect layer and before forming the memory elements:
    bonding the first substrate to a second substrate having a logic chip,
    wherein the first substrate is bonded to the second substrate at the interconnect layer, such that the interconnect structure is electrically connected to the logic chip.

3. The method according to claim 1, wherein:
    the interconnect layer further comprises a periphery of the plurality of memory elements.

4. The method according to claim 1, wherein:
    the semiconductor layer is a crystalline semiconductor layer.

5. The method according to claim 1, wherein:
    each selector device comprises an NPN bipolar transistor with a floating base, a PNP bipolar transistor with a floating base, an NP diode, or a PN diode.

6. The method according to claim 1, wherein:
    the blanket implants are formed with different N/P/N or P/N/P implant energies to respectively form NPN or PNP bipolar transistors with a floating base; and/or
    the blanket implants are formed with different N/P or P/N implant energies to respectively form NP or PN diodes.

7. The method according to claim 1, wherein:
    the selector devices are formed over the entire thickness of the semiconductor layer.

8. The method according to claim 1, wherein:
    the selector devices are formed in a front-side of the first substrate.

9. The method according to claim 1, wherein:
    the memory elements are processed after a back end of line.

10. The method according to claim 1, wherein:
    the selector devices are arranged regularly with a first pitch in the range of 25-100 nm, and
    the memory elements are arranged regularly with a second pitch in the range of 25-100 nm.

11. The method according to claim 1, wherein:
    the first substrate is a semiconductor-on-insulator substrate comprising a semiconductor substrate layer, the oxide layer being arranged on the semiconductor substrate layer and the semiconductor layer being arranged on the oxide layer.

12. The method according to claim 11, further comprising, before forming the memory elements in the oxide layer of the first substrate:
    thinning the first substrate to remove the semiconductor substrate layer and to expose the oxide layer.

13. A memory device fabricated with the method according to claim 1.

14. A memory device, comprising:
    a plurality of selector devices formed in a semiconductor layer of a first substrate by forming blanket implants or by epitaxy, wherein the selector devices are isolated from each other by shallow trench isolation;
    an interconnect layer arranged on a front-side of the semiconductor layer, the interconnect layer having an interconnect structure electrically connected to the plurality of selector devices;
    a plurality of memory elements formed in an oxide layer of the first substrate arranged on a back-side of the semiconductor layer, each memory element being electrically connected to one of the selector devices; and
    one or more vias through the semiconductor layer, the vias electrically connecting the memory elements to the interconnect structure.

15. The memory device according to claim 14, further comprising:
    a second substrate having a logic chip,
    wherein the first substrate is bonded to the second substrate at the interconnect layer, such that the interconnect structure is electrically connected to the logic chip.

16. A memory device fabricated with the method according to claim 2.

17. A memory device fabricated with the method according to claim 3.

18. A memory device fabricated with the method according to claim 4.

19. A memory device fabricated with the method according to claim 5.

20. A method of fabricating a memory device, the method comprising:
    forming a plurality of selector devices in a semiconductor layer of a semiconductor-on-insulator substrate, the semiconductor-on-insulator substrate comprising a semiconductor substrate layer, an oxide layer being arranged on the semiconductor substrate layer and the semiconductor layer being arranged on the oxide layer;
    forming an interconnect layer on a front-side of the semiconductor layer, the interconnect layer having an interconnect structure electrically connected to the plurality of selector devices;
    thinning the semiconductor-on-insulator substrate to remove the semiconductor substrate layer and to expose the oxide layer;
    forming a plurality of memory elements in the oxide layer of the semiconductor-on-insulator substrate arranged on a back-side of the semiconductor layer, each memory element being electrically connected to one of the selector devices; and
    forming one or more vias through the semiconductor layer to electrically connect the memory elements to the interconnect structure.

* * * * *